United States Patent [19]

Hundertmark et al.

[11] Patent Number: 5,627,840
[45] Date of Patent: May 6, 1997

[54] MEMORY BASED INTERFACE

[75] Inventors: Eric K. Hundertmark, Trappe; Duane J. McCrory, Malvern; Todd M. Rimmer, Exton, all of Pa.

[73] Assignee: Unisys Corp., Blue Bell, Pa.

[21] Appl. No.: 529,167

[22] Filed: Sep. 15, 1995

[51] Int. Cl.⁶ .................................................. G01R 31/28
[52] U.S. Cl. ...................... 371/22.3; 371/22.1; 371/22.5; 371/22.6
[58] Field of Search ................................... 371/22.3, 22.1, 371/25.1, 22.5, 22.2; 365/201; 324/158 R, 73.1; 364/490; 395/575

[56] References Cited

U.S. PATENT DOCUMENTS

| | | | |
|---|---|---|---|
| 4,947,357 | 8/1990 | Stewart et al. | 371/22.3 |
| 5,056,093 | 10/1991 | Whetsel | 371/22.3 |
| 5,132,635 | 7/1992 | Kennedy | 324/158 R |
| 5,254,942 | 10/1993 | D'Souza et al. | 324/158 R |
| 5,323,107 | 6/1994 | D'Souza | 324/158 P |
| 5,325,368 | 6/1994 | James et al. | 371/22.3 |
| 5,329,471 | 7/1994 | Swoboda et al. | 364/578 |
| 5,343,478 | 8/1994 | James et al. | 371/22.3 |
| 5,355,369 | 10/1994 | Greenberger et al. | 371/22.3 |
| 5,377,198 | 12/1994 | Simpson et al. | 371/22.3 |
| 5,377,199 | 12/1994 | Fandrich | 371/22.3 |
| 5,379,302 | 1/1995 | Andrews | 371/22.3 |
| 5,448,576 | 9/1995 | Russell | 371/22.3 |
| 5,477,545 | 12/1995 | Huang | 371/22.3 |
| 5,491,666 | 2/1996 | Sturges | 365/201 |

OTHER PUBLICATIONS

Lee Whetsel, Hierarchically Accessing 1149.1 Applications in a System Environment, IEEE, Test Conference 1993 Proceedings, pp. 517–526.

Primary Examiner—Robert W. Beausoliel, Jr.
Assistant Examiner—Nadeem Iqbal
Attorney, Agent, or Firm—John B. Sowell; Mark T. Starr; John F. O'Rourke

[57] ABSTRACT

A method and system for optimizing shift operations by reducing the computational overhead and the number of full scan path shifts associated with accessing and modifying data on a rotating scan path image are disclosed. The system further simplifies the construction of a scan path image by inserting a programmable number of leading and trailing bits around a selected string of data bits. The system manipulates and constructs a scan path image without having to shift or prepare the entire scan path image in memory. Specifically, the system comprises a master controller having a lead bypass module, a trail bypass module, a first shift module, a second shift module, a select module and a shift control module. Collectively, these modules comprise the necessary hardware for executing a plurality of shift optimization functions which include lead and trail bypass insertion, non-destructive read, field isolation, field insertion, bit order reversion, bit rotation and simultaneous read and write operation. The system further incorporates shift access windows and status registers for implementing shift operations without system calls.

31 Claims, 9 Drawing Sheets

MEMORY BASED INTERFACE

FIELD OF THE INVENTION

The invention relates to improvements in serial boundary-scan testing of circuit boards. More particularly, the invention relates to a method and system for optimizing shift operations by reducing the computational overhead and the number of full scan shifts associated with accessing and modifying data on a rotating scan path image. This includes several novel performance improvement features including shift operations without system calls.

BACKGROUND OF THE INVENTION

The increasing complexity of surface-mount interconnection technology and integrated circuit packaging techniques presents an ever increasing problem of testing integrated circuits and printed circuit boards (system logic board). The main goals of these tests are to confirm the correct interconnection of components, the proper function of each component and the proper interaction of components in a product. To achieve these goals, the international Joint Test Action Group (JTAG) created the IEEE 1149.1 (1990) test access port and boundary-scan architecture standard (JTAG standard), which is incorporated herein in its entirety by reference. The primary goal of this standard is to ensure that circuit components contain a common denominator of test circuitry.

One implementation of the JTAG standard incorporates test access port (TAP) for accessing the test support functions built into an integrated circuit component or a system logic board. The TAP serves as a diagnostic interface. The TAP is composed, as minimum, of three input connections and one output connection as defined by the IEEE 1149.1 standard. The three input connections are defined as test clock input (TCK), test data input (TDI), and test mode select input (TMS), while the output connection is defined as test data output (TDO). In addition, an optional fourth input connection defined as test reset input (TRST*) is permitted by the standard for initialization of the TAP controller. For a detailed discussion of these signal connections, see the IEEE 1149.1 standard (1990).

The implementation further incorporates shift register segments into an integrated circuit component for serial boundary-scan testing. The shift register segments are daisy chained to form a path around the periphery of the integrated circuit component. In turn, a number of circuit components are typically chained together so that test data is shifted serially into and through a plurality of circuit components. The serial test data (scan path image) follows a predefined path and exits the circuit components with the test data altered by the circuit functions. A controller compares the altered test data with expected known results and determines whether the circuit components are in good working order. If the test data produces an unexpected result, then a malfunction has been detected within the circuit.

Specifically, a scan cycle either shifts the content of the TAP's instruction register or it shifts the contents of the shift register based circuits on the selected test data register path. The instruction register allows instruction to be serially entered into the test logic. Each instruction defines the set of test data registers that may operate while that instructions is current, and the instruction also selects the test data register path to shift by a subsequent data register scan cycle. The selected test data register path is typically a bank of shift register based circuits used for conditioning values and receiving stimuli.

The flexibility of this architecture permits the daisy chaining of IEEE 1149.1 compliant circuit components both within as well as across system logic boards. A plurality of system logic boards can be efficiently tested by propagating a long scan path image through the integrated circuit components of a system logic board and then directing the scan path image to the next daisy chained system logic board. Finally, the serial data is returned to the controller from the last circuit component on the last daisy chained system logic board.

Although the JTAG standard increases the efficiency and reduces the cost of component and logic board testing, the daisy chaining scheme is computationally expensive as the number of circuit components increases within a system logic board. In order to access a particular register of a circuit component within a daisy chain, the controller must construct a long data string (scan path image) having a length that equals the sum of all the registers of the chained components.

To illustrate, if the controller needs to read and write to a 3-bit wide instruction register of the 10th chained component from a daisy chain of one hundred (100) components, the controller needs to read 300 bits of data (100 components with each having a 3-bit wide instruction register) into system memory. The controller obtains the relevant three bits of data from the system memory by applying a conventional bit extraction technique. Subsequently, in order to write to the selected instruction register, the controller reconstructs a new 300 bit scan path image having three new bits of data. The new scan path image is then shifted serially back to the daisy chained components. Thus, the read/write operation of three (3) bits of data requires the shifting of 600 bits of data to and from the system memory. As the complexity and quantity of circuit components and logic boards increase, the daisy chaining scheme creates a large computational overhead.

Another deficiency of current systems involves the use of "system calls" by software applications. Generally, in order for a software application to execute a test sequence (i.e. performing a plurality of shift operations), the software application may need to issue a plurality of system calls. System calls provide the interface between a process and the operating system. System calls are roughly grouped into five major categories: process control, file manipulation, device manipulation, information maintenance, and communication.

In order for an application to access and perform I/O operations on a target device hardware such as a system logic board, a system call path is generally established through the operating system or "kernel". Such system calls require the use of interrupts which have an overhead on the order of hundreds of microseconds. Conversely, the operation of shifting a short string of data typically has an overhead on the order of several microseconds. Thus, the overhead of the input/output (I/O) requests actually exceeds the overhead of the I/O operation itself (i.e. a shift operation).

Therefore, a need exists in the art for a system and method that optimizes shift operations by reducing the computational overhead and the number of full scan path shifts associated with accessing and modifying scan data.

SUMMARY OF THE INVENTION

The present invention involves a method and system for reducing the computational overhead and the number of full scan path shifts associated with accessing and modifying data on a rotating scan path image. In particular, the present invention reduces the number of full scan path shifts by selectively extracting and/or inserting a plurality of bits from a rotating scan path image. Furthermore, the present invention simplifies the construction of a scan path image by inserting a predetermined number of leading and trailing bits around a selected string of data bits. Finally, the present invention incorporates shift access windows and status registers for implementing shift operations without using system calls.

The present invention provides a system to efficiently manipulate and construct a scan path image without having to shift or prepare the entire scan path image in memory. The system comprises a TAP master controller having a lead bypass module, a trail bypass module, a shift TDO module, a shift TDI module, a select module and a shift control module. Collectively, these modules comprise the necessary hardware for executing a plurality of shift optimization functions which include lead and trail bypass insertion, field isolation, field insertion, bit order reversion, bit rotation, non-destructive read and simultaneous read and write operation.

The shift control module is electrically coupled to the lead bypass, trail bypass, shift TDO, shift TDI and select modules for controlling the shifting of data between the system memory of a computer system and a target circuit component or a target system logic board. Specifically, the shift control module is a state machine that controls the shifting of data on the TDI and TDO signal connections in accordance with a particular optimization function.

The select module is essentially a 4-to-1 multiplexor with its output coupled to the TDO signal connection. The lead bypass, trail bypass, shift TDO and shift TDI modules are coupled to the inputs of the multiplexor for providing the TDO signals. The proper selection of a TDO signal source through the multiplexor is controlled by the shift control module in accordance with the current shift optimization function.

The shift TDI and shift TDO modules operate to channel data to and from the system memory respectively. Furthermore, these modules perform data format conversion where serial data is converted to parallel data and vice versa.

The lead bypass and trail bypass modules operate to assert the necessary logical value of lead bypass bits and trail bypass bits respectively to efficiently construct a scan path image. These two modules in combination with the modules discussed above provide several optimization features.

The first optimization simplifies the construction of a scan path image by inserting a programmable number of leading and trailing bits around a selected string of data bits. This optimization takes advantage of the fact that often the system is only interested in the contents of a specific test data register within a scan path. To construct a scan path image for accessing a particular data register, software supplies the initial lead and trailing bypass counts to the hardware so that the data transfer portion of the operation is properly aligned with the location of the particular component on the scan path. With this information, the scan path image is simultaneously constructed and shifted by causing the lead bypass module to issue a number of lead bypass bits. Next, the actual data is shifted from the system memory through the shift TDO module, followed by a number of trailing bits issued from the trail bypass module. Thus, the scan path image is completely constructed and shifted without having to construct the entire scan path image in system memory.

Specifically, one situation where leading and trailing bits are beneficial is when the instruction register of all TAPs in a scan path are to be set to the Bypass state except for the TAP in one particular ASIC. In this case the leading and trailing bits can be used to automatically load a "1" into each instruction register bit of the TAPs located before and after the specific TAP in which the system desires to access data. This feature is incorporated with shifting so that Bypass is selected and the specific TAP is loaded with a programmable value using a single scan cycle.

Furthermore, the system incorporates a "circular shift" hardware implementation. This implementation reduces the number of full scan path shifts required to read and modify a register on a scan path. Namely, the TDI connection of the controller is logically connected to the TDO connection such that as data is shifted out of the scan path, new data (possibly altered or unaltered) is shifted back into the same scan path. This revolving configuration provides a set of circular shift optimization features such as non-destructive read, field isolation, field insertion, and simultaneous read and write operation.

The first circular shift feature is non-destructive read. A non-destructive read is an operation where the contents of a scan path image is shifted into system memory, but the contents of the scan path image remains unaltered at the end of the shift operation. To perform a non-destructive read operation, the scan path image is configured as a loop with the output of the scan path image directed toward its input.

The second circular shift feature is field isolation. This feature reduces the number of shifts, computational overhead and the buffer requirement between the controller and system memory by isolating a field of data within a selected register. To selectively extract this isolated field of data, the starting bit of the isolation function is communicated to the controller. As the scan path image is circulated as described above, the controller detects the starting bit and channels the isolated field of data from the selected register to the system memory through the shift TDI module.

The third circular shift feature is field insertion. This feature reduces the number of full scan path shifts and the computational overhead for such operations by isolating a field of data within a register to be modified. To selectively modify a field of data, the starting bit of the insert function is communicated to the controller. As the scan path image is circulated, the controller detects the starting bit and modifies an isolated field of the scan path image with the data from the system memory via the shift TDO module.

The fourth circular shift feature is simultaneous read and write. This feature reduces the number of full scan path shifts by allowing a single shift operation to both transfer data to and from the system memory and the controller. To perform a simultaneous read and write operation, a read buffer and a write buffer are communicated to the controller. As the scan path image is circulated, the controller selectively moves data between the write buffer and the TDO connection and simultaneously moves data between the read buffer and the TDI connection.

The third shift optimization feature is bit order reversion. This feature allows a scan path image to be maintained in memory in an order native to the host processor. Since the bit shift order is defined by the scan path, the ordering of the data bits within a register is often opposite to the preferred bit ordering of the host processor. To reverse the order of the scan path image, the controller calculates an appropriate bit address from the length of the scan path image, and then reads/writes the data bits to/from the selected register into consecutively decreasing bytes of the system memory.

The fourth shift optimization feature is called bit rotation. This optimization allows read/write operations to be performed on a set of disjoint bit fields within the scan path using a single full scan path shift. This optimization applies concatenated uses of the field isolation or field insertion features in order to collect and disburse bit fields between memory and a test data path. As the scan path image is circulated, the field isolation/insertion feature is selectively activated to access (read/write) individual bit fields in the test data path. Bits in the test data path that are not included within one of the disjoint bit fields in the specified set are rotated back through the TDO signal connection without modification.

Furthermore, the present invention incorporates shift access windows and status registers for implementing shift operations without system calls. The shift access windows are mapped onto the system memory and are used to store instructions and data for accessing a particular hardware device. Each shift access window is linked to a status register which displays the operational status of the shift access window. By assigning a separate shift access window to each software application, multiple software applications may simultaneously request for hardware access to perform shift operations without system calls. Each application will simply write the relevant data and instructions to its shift access window and set the status register. In turn, the controller polls the multitude of status registers and executes any pending requests in accordance with the information stored in each shift access window. In this fashion, shift operations are accomplished without the use of system calls.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
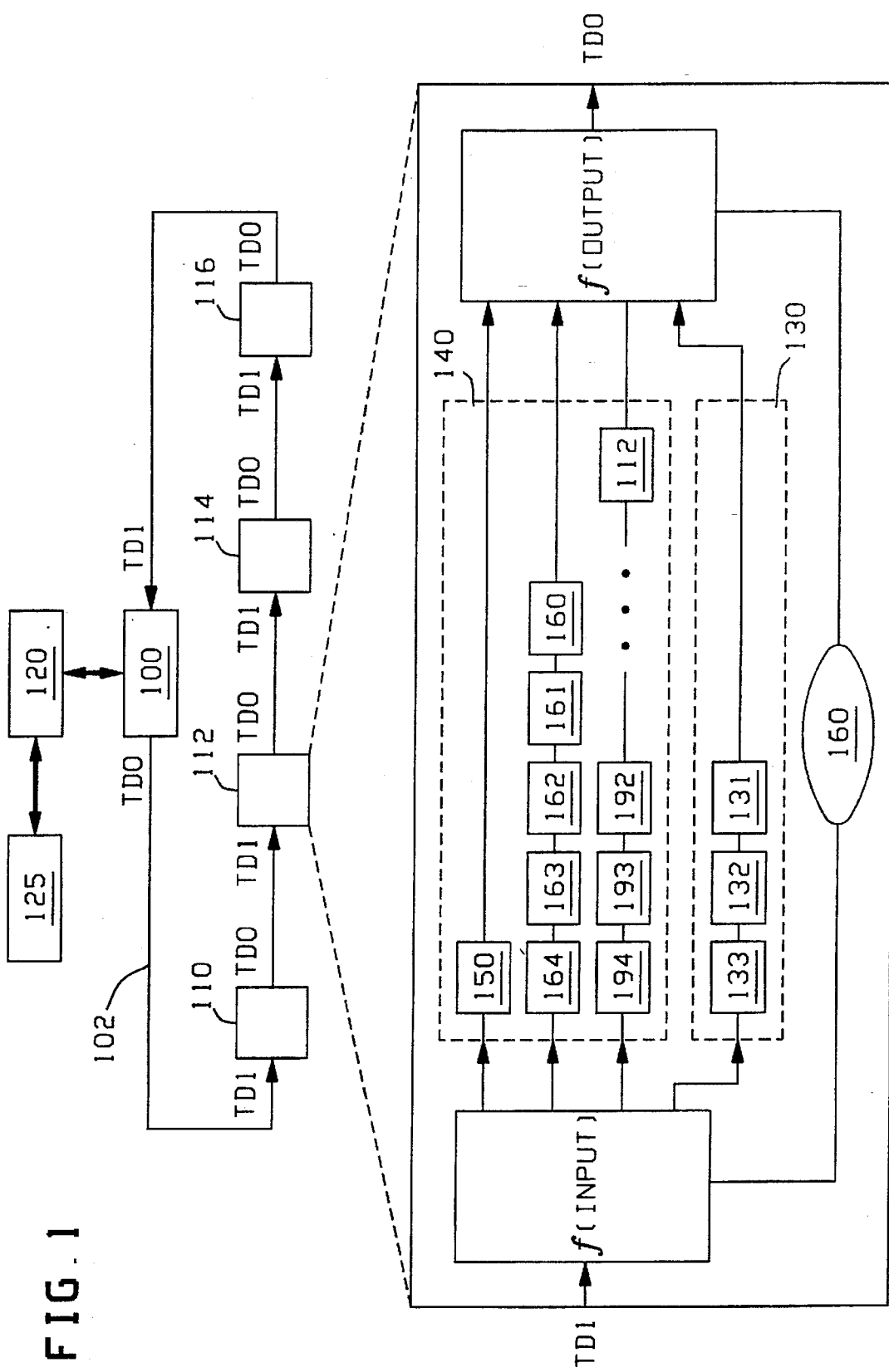
FIG. 1 illustrates a block diagram of circuitry incorporating the system of the present invention for performing shift operations in accordance with the JTAG standard.

FIG. 1 depicts a block diagram of circuitry incorporating system 100 of the present invention for performing shift operations in accordance with the JTAG standard. The system 100 serves to transfer data to and from a system memory 120 and a JTAG scan path 102 connecting a plurality of IEEE 1149.1 compliant components or application specific integrated circuits (ASIC). In turn, the system memory is electrically coupled to a host processor 125, which serves as the central processor for a computer system or test system.

FIG. 1 further illustrates a JTAG scan path 102 connecting four (4) JTAG complaint components which are illustrated as ASICs 110, 112, 114, and 116. An extensive number of such ASICs are commercially available from manufacturers such as Intel Corporation, Texas Instrument and AT&T. The TDI and TDO designations on the scan path 102 reflects the IEEE 1149.1 definitions of test signal connections from the perspective of each ASIC. Thus, ASIC 110 perceives its output as TDO while ASIC 112 perceives the same connection, its input, as TDI. Although only four ASICs are illustrated, those skilled in the art will realize that a JTAG scan path is not limited to such a configuration and accommodates any number of ASICs. Generally, a JTAG scan path connects a multitude of circuit components of a single system logic board or a plurality of system logic boards. In fact, the features of the present invention provide significant improvements in much larger configurations.

Furthermore, the current invention is described with respect to the IEEE 1149.1 standard. However, the IEEE standard is only used to illustrate the benefits of the present invention. Thus, the current invention provides significant improvements in other types of I/O buses and is not limited to the IEEE 1149.1 standard.

Each IEEE 1149.1 compliant circuit component comprises an instruction register (IR) 130 and a bank of data registers (DR) 140 for supporting two types of register shift operations, instruction register shifts (IR shifts) and data register shifts (DR shifts). An IR shift updates the contents of the IR register bits (e.g. 133, 132, 131) in each device of the scan path 102. A DR shift updates the contents of one of the data registers (e.g. 150, 164–160, 194–172)in each device of the scan path 102. The selection of a particular data register for updates is a function 160 of the current IR values in the instruction register 130. The f(input) and f(output) functional blocks coordinate the movement of scan data into and out of the internal scan register elements. These functional blocks are effected by the IR value 130, TAP state and JTAG control signals (e.g. TMS, TRST* and TCK) which are collectively illustrated as function 160.

Figure 2:
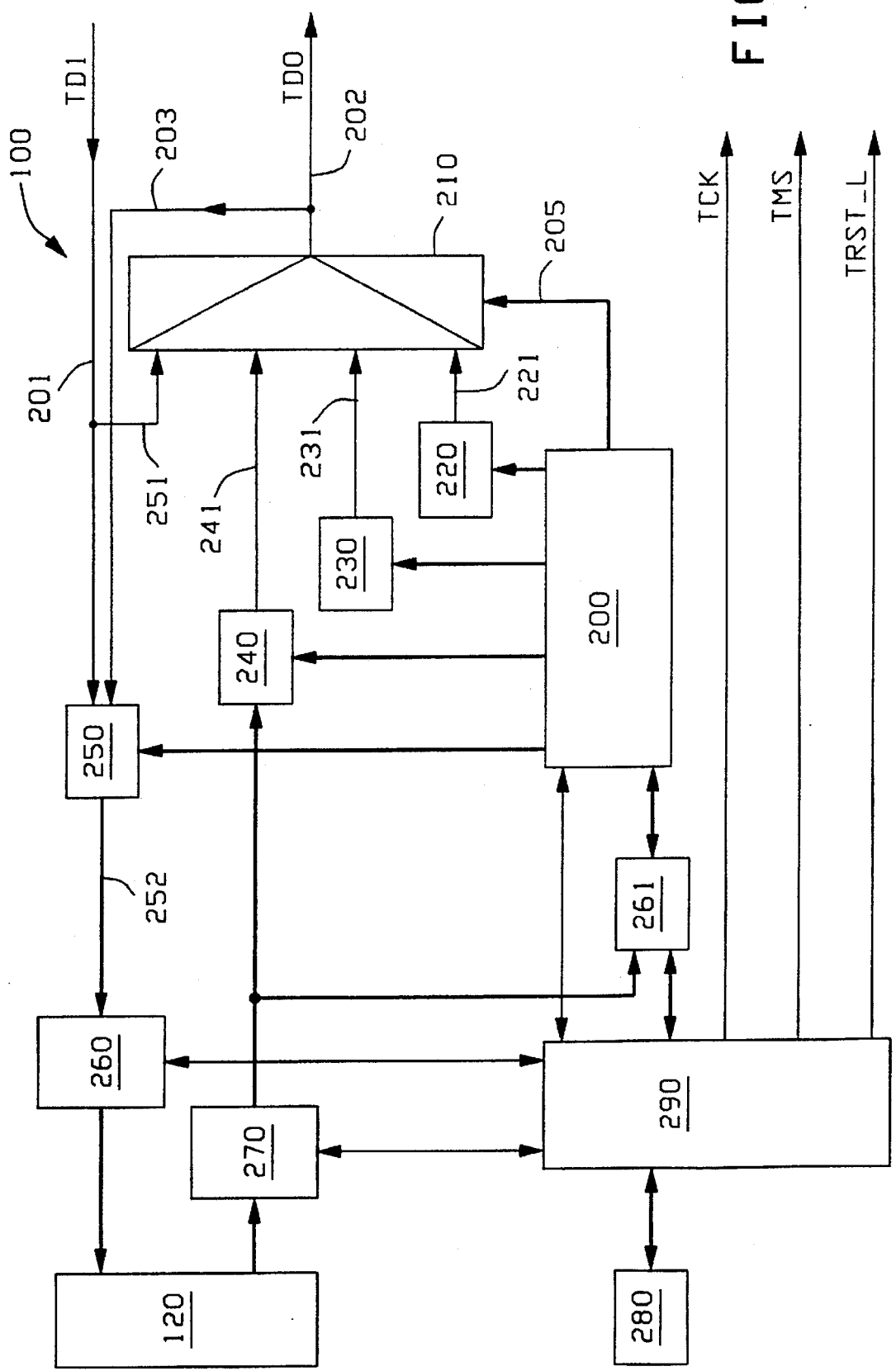
FIG. 2 is a schematic diagram of the system of the present invention.

FIG. 2 is a schematic diagram of the system 100 of FIG. 1. System 100 is a TAP master controller having a lead bypass module 230, a trail bypass module 220, a shift TDO module 240, a shift TDI module 250, a select module 210 and a shift control module 200. These modules implement the features of the present invention which include lead and trail bypass insertion, non-destructive read, field isolation, field insertion, bit order reversion, bit rotation and simultaneous read and write operation. These features are described below with reference to both FIG. 1 and FIG. 2.

In the preferred embodiment of the present invention, the shift control module 200 is electrically coupled to the lead bypass 230, trail bypass 220, shift TDO 240, shift TDI 250 and select modules 210 as illustrated in FIG. 2. The shift control module 200 controls the shifting of data between the system memory 120 and the plurality of ASICs 110, 112, 114 and 116. Specifically, the shift control module is a 3-bit state machine that controls the shifting of data on the TDI signal connection 201 and TDO signal connection 202 of scan path 102 in accordance with a particular optimization function. Additionally, shift control module 200 operates a plurality of counters 261 for keeping track of bit counts.

In the preferred embodiment, the select module 210 is generally a 4-to-1 multiplexor with its output coupled to the TDO signal connection 202. The lead bypass 230, trail bypass 220, shift TDO 240 and shift TDI 250 modules are coupled to the inputs of the multiplexor as sources of the TDO signals. The proper selection of a TDO signal source through the multiplexor is controlled by the shift control module 200 via signal connection 205 in accordance with the current shift optimization function.

The shift TDI module 250 shifts data from the TDI signal connection 201 to the system memory 120 via signal connection 252. Since read/write operations in system memory involve the movement of data in parallel form (words), the shift TDI module 250 incorporates a plurality of flip-flops (not specifically shown) for converting the serial data received on the TDI signal path into 32-bit words. The clock to each of the plurality of flip-flops is sequentially enabled in accordance with a 5-bit counter (not shown) such that the next (n+1) or (n−1) flip-flop is enabled to receive the next bit of data. This bi-directional shift capability within the shift TDI module 250 is utilized in the bit order reversion feature which is described below.

The serial data on the TDI signal connection 201 is also channeled to the select module 210 via signal connection 251 where the serial data is restored to the TDO signal connection 202. This configuration supports the field insertion, field isolation and circular shift features of the present invention which are described below. Furthermore, the output to the select module 210 is routed through an internal loopback path 203 for supporting internal diagnostic functions.

The shift TDO module 240 operates to channel data from the system memory 120 to the TDO signal connection 202. In the preferred embodiment, the shift TDO module incorporates a 32-bit register and a 32-to-1 multiplexor (not shown) for converting the parallel data received from the system memory 120 into serial data. In use, a word from system memory is received into the 32-bit register where a 5-bit counter (not shown) controls the multiplexor to select an individual bit for transfer to the TDO signal connection 202. Similar to the shift TDI module, the shift TDO module 240 supports bi-directional shifts. Namely, shifting of data bits from the 32-bit register generally proceeds from bit 0 to bit 31. In reverse order shifts, shifting of data bits proceeds from bit 31 (or a bit location determined by the total bit count of a word) to bit 0. This configuration permits the implementation of bit order reversion.

Furthermore, an optional write interface module 260 and a read interface module 270 are coupled to the shift TDI 250 and shift TDO 240 modules respectively for performing write and read operations to and from the system memory 120. Computer systems often incorporate an integrated channel adapter (ICA) (not shown) for performing the actual memory read/write cycles or "interport" cycles. In such case, interface modules 260 and 270 are incorporated to control the transfer protocol. Generally, read and write buffers (not shown) are incorporated to transfer data between the interface modules 260, 270 and the ICA. Since other modules on the controller may need to access the system memory 120, the interface modules 260 and 270 also serve to arbitrate simultaneous memory requests through a multiplexing scheme.

The lead bypass module 230 and trail bypass module 220 operate to assert the necessary logical value of lead bypass bits and trail bypass bits respectively to construct a scan path image. These bypass modules serve to insert a programmable number of preceding and succeeding bypass bits around a field of selected data on the scan path 102. Each bypass module incorporates a 11-bit counter (not shown) that decrements from a programmable value down to zero as TCK clock pulses are issued. When the counter reaches zero, the shift control module 200 turns off the corresponding bypass module, thereby terminating the bypass operation.

FIG. 2 further depicts a control module 290 which serves to control the overall operation on a TAP master controller, such as controlling and generating the conventional JTAG signals e.g., TCK, TMS and TRST* signals. This control module may comprise a plurality of state machines and combination logic. A plurality of status registers 280 is coupled to control module 290 for implementing system call-less I/O operations which is described in detail below.

The system 100 accomplishes a multitude of shift optimization features. Frequently, higher level functions are only interested in accessing and/or modifying the data register bits of a particular DR in a particular ASIC. To accomplish such access, a sequence of shift operations are required such as performing an IR shift to select a data register and then performing a DR shift to retrieve/modify the selected data bits. Traditionally, the scan path images associated with these shift operations are constructed entirely in system memory, which are then shifted to the target component on the scan path.

To illustrate, if an application software needs to update the values stored in DR bits 164–160 of ASIC 112, then a 12-bit (4 ASICs×3 IR bits per ASIC) scan path image is constructed to select a DR in each ASIC. In such instance, the states of the data bits preceding and succeeding the target register are not modified by the controller. Ideally, ASICs 110, 114 and 116 are "bypassed" during this operation. In order to minimize the number of bits in a DR shift, the JTAG standard requires all compliant circuit components to carry a 1-bit data register known as the bypass register 150. To select the bypass register, all the bits of the ASIC's instruction register must contain the values of "1". For example, if DR bits 164–160 of ASIC 112 are selected when its IR value is 010 (a binary value), then a 12-bit IR scan path image having the value 111010111111 (assuming least significant bit is shifted first) is constructed to bypass ASICs 110, 114 and 116 and to select DR bits 164–160.

The lead and trail bypass insertion feature of the present invention optimizes both IR and DR shifts by minimizing the movement of bits to and from system memory and by simplifying the operation of constructing a scan path image. The present invention allows an application software to describe the number of leading and trailing bits in the scan path image. Thus, the illustrative 12-bit IR scan path image described above is expressed as six (6) leading "1" followed by the data pattern 010 which is followed by three (3) trailing "1".

To construct the commands for accessing a particular component, software may consult a static lookup table in order to determine the values needed to be programmed into the lead and trail bypass bit counters so that the data transfer portion of the operation is properly aligned with the location of the particular component on the scan path. With this information, the shift control module 200 causes the lead bypass module 230 to insert a programmable number of lead bypass bits on the scan path 102 through select module 210. Subsequently, the actual data is shifted from system memory 120 through the shift TDO module 240 onto the scan path 102 and is followed by a programmable number of trail bypass bits from the trail bypass module 220. Thus, the scan path image is completely constructed and shifted without having to construct the entire scan path image in system memory. As the number of ASICs and the length of their corresponding IR(s) in the scan path increase, the automatic lead and trail bypass insertion feature greatly improves the efficiency of shift operations. However, those skilled in the art will realize that the automatic lead and trail insertion feature can be applied to DR shifts with the same effect.

Furthermore, the system incorporates a "circular shift" hardware implementation. This implementation provides a set of circular shift optimization features. The circular shift configuration reduces the number of shifts required to read and/or modify a target register by incorporating a revolving scheme. As the scan path image is shifted on the TDI signal connection 201 toward the system memory 120, new contents can be selectively and simultaneously shifted from the system memory 120 through the shift TDO module 240. In effect, as the existing states or values are read from one end (output) of the scan path image, new contents are selectively shifted into another end (input) of the scan path image. This revolving configuration provides a number of circular shift features such as non-destructive read, field isolation, field insertion and simultaneously read and write operation.

A feature of the circular shift implementation is the ability to perform non-destructive read. Frequently, higher level functions perform non-destructive read where a copy of the contents of a DR is stored into system memory and the DR pattern is restored to its original state. Traditionally, such non-destructive read operation requires a DR shift to the system memory, followed by another DR shift to move the memory copy of the DR pattern back into the DR registers. This redundant movement of the DR pattern increases the computational overhead of shift operations.

To perform a non-destructive read operation, the TDI signal connection 201 is logically connected to the TDO signal connection 202 such that as data is read into system memory 120, the scan path image is simultaneously restored to the target register through the select module 210 via signal connection 251. Thus, when the scan path image of length n is shifted by n number of clock pulses, the original states of the target register are restored. The non-destructive read feature of the present invention effectively reduces the overhead of performing such read operation by fifty percent (50%) by eliminating the step of restoring the scan path image from the system memory 120.

Another feature of the circular shift implementation is field isolation. Often a DR within an ASIC contains a DR pattern with a large number of bits (e.g. 194–172) having several implementation specific portions of data. In order to read a portion of the data within the DR, higher level functions traditionally allocate a buffer of sufficient size in the system memory to hold the entire DR pattern. Subsequently, conventional bit extraction techniques are employed to obtain the relevant bits from the system memory.

The field isolation feature of the present invention reduces the number of shift operations and the buffer requirement by isolating a field of data from a circulating scan path image. In essence, field isolation enables the controller to only read a portion of the entire scan path image and write it to system memory.

To illustrate, if DR bits 192 and 193 are selected for access, higher level functions communicate the total length of the DR (i.e. 23=194−172+1) to the controller. In addition, the controller receives the starting bit of the isolation function (i.e. 20=192−172) and the number of bits to isolate (i.e. 2=193−192+1). Using this information, the shift control module 200 returns the initial portion of the scan path image from the TDI signal connection 201 to the TDO signal connection 202 as discussed in the non-destructive read operation. During this phase, the shift TDI 250 and shift TDO 240 modules are not active. As the scan path image continues to circulate, the controller detects the starting bit and activates the shift TDI module 250 to read two (2) bits of data and write them to system memory 120. These two bits of data are also contemporaneously returned to the scan path 102 via TDO signal connection 202. After the two bits of data are channeled into the system memory, the shift TDI module is deactivated and the remaining portion of the scan path image is restored to the DRs. Thus, the field isolation feature enables the controller to selectively copy a small portion of data from a DR within a long scan path image to the system memory. As illustrated, two (2) bits from a 23-bit register can be effectively isolated and read from a scan path image comprising possibly of 1,000 bits or more. The field isolation feature significantly reduces the number of shift operations and the size of the buffer requirement.

The field insertion feature of the present invention is a complement function to the field isolation feature. In essence, the field insertion feature enables the controller to modify a portion of a circulating scan path image from data stored in the system memory.

Using the above example, if DR bits 192 and 193 are selected for modification, higher level functions communicate the total length of the DR, and the number of bits to be modified to the controller. Using this information, the shift control module 200 returns the initial portion of the scan path image from the TDI signal connection 201 to the TDO signal connection 202. When the controller detects the starting bit, it activates the shift TDO module 240 to replace two (2) bits of data on the scan path image with data from the system memory 120. After the two bits of data are inserted, the remaining portion of the scan path image is restored to the DRs. Thus, the field isolation feature enables the controller to selectively read data from system memory and write it to a selected portion of the DR within a long scan path image.

Another feature of the circular shift implementation is simultaneous read and write operation. Typically, when configuration or status information within a DR is modified, the values within a DR are saved and updated. In the prior art, two separate shift operations, a DR shift to system memory and a DR shift from system memory, are required to save and update the values within a DR. The simultaneous read and write feature of the present invention reduces shift operations by allowing a single shift operation to both transfer data to and from the system memory and the controller.

To illustrate, if DR bits 194 through 172 of ASIC 112 are selected for a simultaneous read and write operation, then only a single shift operation of 26 bits (1 bypass bit from each ASIC 110, 114 and 116 plus 23 DR bits from ASIC 112) is executed to accomplish the twofold operation. To perform a simultaneous read and write operation, a read buffer and a write buffer (not shown) in system memory 120 are communicated to the controller. As the scan path image is circulated, the shift control module 200 selectively moves data between the write buffer and the TDO connection 202 and simultaneously moves data between the TDI connection 201 and the read buffer. Furthermore, the simultaneous read and write feature can be used in conjunction with the field isolation and insertion features to read and write to a selected portion of a DR. Thus, the current feature effectively eliminates one entire DR shift operation from the traditional method of performing simultaneous read and write operation.

Another shift optimization feature of the system is bit rotation. Often, it is necessary to access non-contiguous fields of data in a single DR. In order to access these disjointed portions of data in a single full scan path shift, the bit rotation feature applies concatenated uses of the field isolation or field insertion features.

The actual instruction format used to describe a shift operation is implementation dependent. The present embodiment uses a compact, fixed length instruction referred to as an IOCB. In the present embodiment of this invention, multiple IOCBs are required to complete an access to multiple non-contiguous fields within a single DR. However, a set of instructions can be constructed (e.g. using IOCB chaining) so that an entire bit rotation operation on a single DR is accomplished with a single full scan path shift. Other instruction formats are possible, including variable length instructions. For instance, an implementation may choose a variable length instruction format so that all the fields in a bit rotation operation are defined within a single instruction. In either case, a bit rotation operation can be completed on a single DR using a single full scan path shift.

To illustrate, if DR bits 175, 176, 192 and 193 of ASIC 112 are selected for isolation, then two operations are needed to separately isolate the two disjointed sets of data, through the use of the field isolation feature of the present invention, in a single full scan path shift. As the scan path image is circulated, the shift control module 200 detects the first starting bit (175) and activates the shift TDI module 250 to read two (2) bits of data into system memory 120. Next, bits 177 through 191 are circulated without modification. Finally, the shift control module 200 detects the second starting bit and activates the shift TDI module 250 to read two (2) additional bits of data into system memory 120. After the second set of data is written into system 120, the shift TDI module 250 is deactivated and the remaining portion of the scan path image is restored to the DRs. Although the current example uses the field isolation feature to illustrate the operation of the bit rotation function, a more significant benefit is realized when field insertion is used to modify disjointed portions of data within a DR.

To illustrate, if DR bits 175, 176, 192 and 193 of ASIC 112 are selected for modification, then two operations are needed to separately isolate and modify the two disjointed sets of data through the use of the field insertion feature of the present invention. To further enhance this significant improvement, bit rotation is applied to accomplish both modifications in a single full scan path shift. As the scan path image is circulated, the shift control module 200 detects the first starting bit and activates the shift TDO module 240 to read two (2) bits of data from the system memory 120. Next, bits 177 through 191 are circulated without modification. Finally, the shift control module 200 detects the second starting bit and activates the shift TDO module 240 to read two (2) additional bits of data from the system memory 120. After the second set of data is channeled to the TDO signal connection 202, the shift TDO module 240 is deactivated and the remaining portion of the scan path image is restored to the DRs. Thus, the modification of disjointed sets of data on a scan path image is accomplished in a single full scan path shift.

Another shift optimization feature of the system 100 is bit order reversion. This feature allows a scan path image to be maintained in system memory 120 in an order native to the host processor. Often, the ordering of data bits within a DR is opposite to the preferred bit ordering of the host processor 125. Generally, each host processor stores and retrieves data bits to and from system memory in one of two orders, least significant bit (LSB) or most significant bits (MSB) as illustrated in Table 1 using DR bits 164–160.

TABLE 1

|  | 164 | 163 | 162 | 161 | 160 |
| --- | --- | --- | --- | --- | --- |
| LSB | $D_4$ | $D_3$ | $D_2$ | $D_1$ | $D_0$ |
| MSB | $D_0$ | $D_1$ | $D_2$ | $D_3$ | $D_4$ |

Since the bit shift order is defined by the scan path 102, the first bit is always loaded into bit 0 (LSB) of the least significant address in system memory. As the shift progresses, bit locations and addresses are incremented until the full bit count expires. Processors such as the Intel based 80×86 microprocessor also use the LSB native bit order. In an embodiment where the Intel based 80×86 microprocessor is used, the controller simply stores/retrieves bits to/from the DR from/into consecutively increasing bits and bytes of the system memory 120.

However, if the bit order of a host processor is MSB, then an additional operation is needed to reverse the bit order. To reverse the order of the scan path image, the controller calculates an appropriate bit address from the length of the scan path image, and then reads/writes the data bits to/from the selected register into consecutively decreasing bytes of the system memory. The bit count is divided by the memory word bit width such that the quotient yields the word offset from the starting address and the remainder yields the bit offset for the first bit shifted. Thus, as the shift progresses, bit locations and addresses are decremented.

In addition to addressing the various host processor bit orderings, the bit order reversion feature has another common use. During the design of sophisticated ASICs, a designer often must make a number of tradeoffs between the implementation complexity of an ASIC and the organization of various registers such as the JTAG DRs. Those skilled in the art will realize that it is often difficult to have the DR bits in a consistent order due to the internal design of a chip. It is quite common to find ASICs which have DRs in both LSB first order and MSB first order. Thus, the bit order reversion feature of this invention provides an efficient and effective mechanism to handle such situations.

In the preferred embodiment of the present invention, the shift TDI and shift TDO modules possess the capability to calculate the initial bit location for the first bit shifted and to decrement the bit location as reverse order shifts progress. The implementation of the bit order reversion feature by the shift TDI module 250 and the shift TDO module 240 is accomplished through their ability to support bi-directional shifts as described above. Namely, shifting of data bits from the 32-bit register (or flip-fops) generally proceeds from bit 0 to bit 31. In reverse order shifts, shifting of data bits proceeds from bit 31 (or a bit location determined by the total bit count of a word) to bit 0. Furthermore, the bit order reversion feature can be used in conjunction with the field isolation and insertion features to read and write to a selected portion of a DR. Thus, the bi-directional shift capability permits the implementation of the bit order reversion feature by the shift TDI and shift TDO modules.

The present invention also incorporates shift access windows and status registers for implementing shift operations without system calls. Generally, in order for a software application to execute a test sequence (i.e. performing a plurality of shift operations), the software application may need to issue a plurality of system calls. System calls provide the interface between a process (software application) and an operating system. However, the overhead of the system call itself may actually exceed the overhead of a shift operation.

Figure 3:
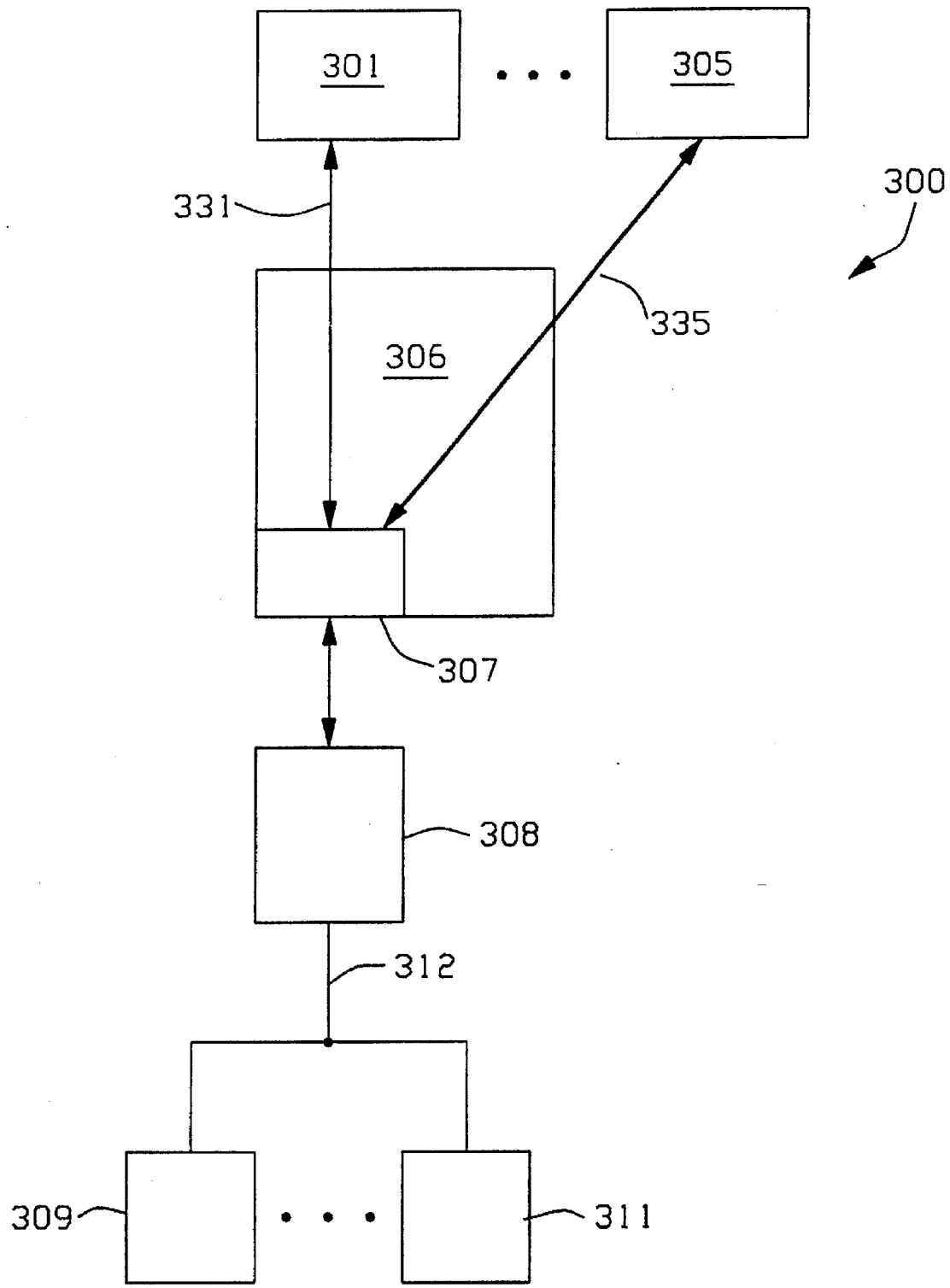
FIG. 3 is a functional block diagram of a system using a conventional system call based operation.

To illustrate, FIG. 3 is a functional block diagram of a conventional system call based operation. The system 300 has a plurality of software applications 301–305 that require access to a plurality of target hardware devices or system logic boards 309–311. To accomplish a hardware access, the software applications establish system call paths 331–335 to access a device driver 307 through an operating system 306. The device driver 307 exclusively controls a I/O controller 308 which, in turn, exercises an I/O bus to communicate with the hardware devices 309–311.

An illustrative system of FIG. 3 is a computer system having a plurality of SCSI disk drives. Thus, the illustrative system comprises a SCSI bus controller 308, a SCSI I/O bus 312 and a plurality of SCSI disks 309–311. In order for the software applications to access and execute I/O operations on a particular SCSI disk, a multitude of system calls are issued through the operating system, thereby incurring a substantial I/O overhead.

Figure 4:
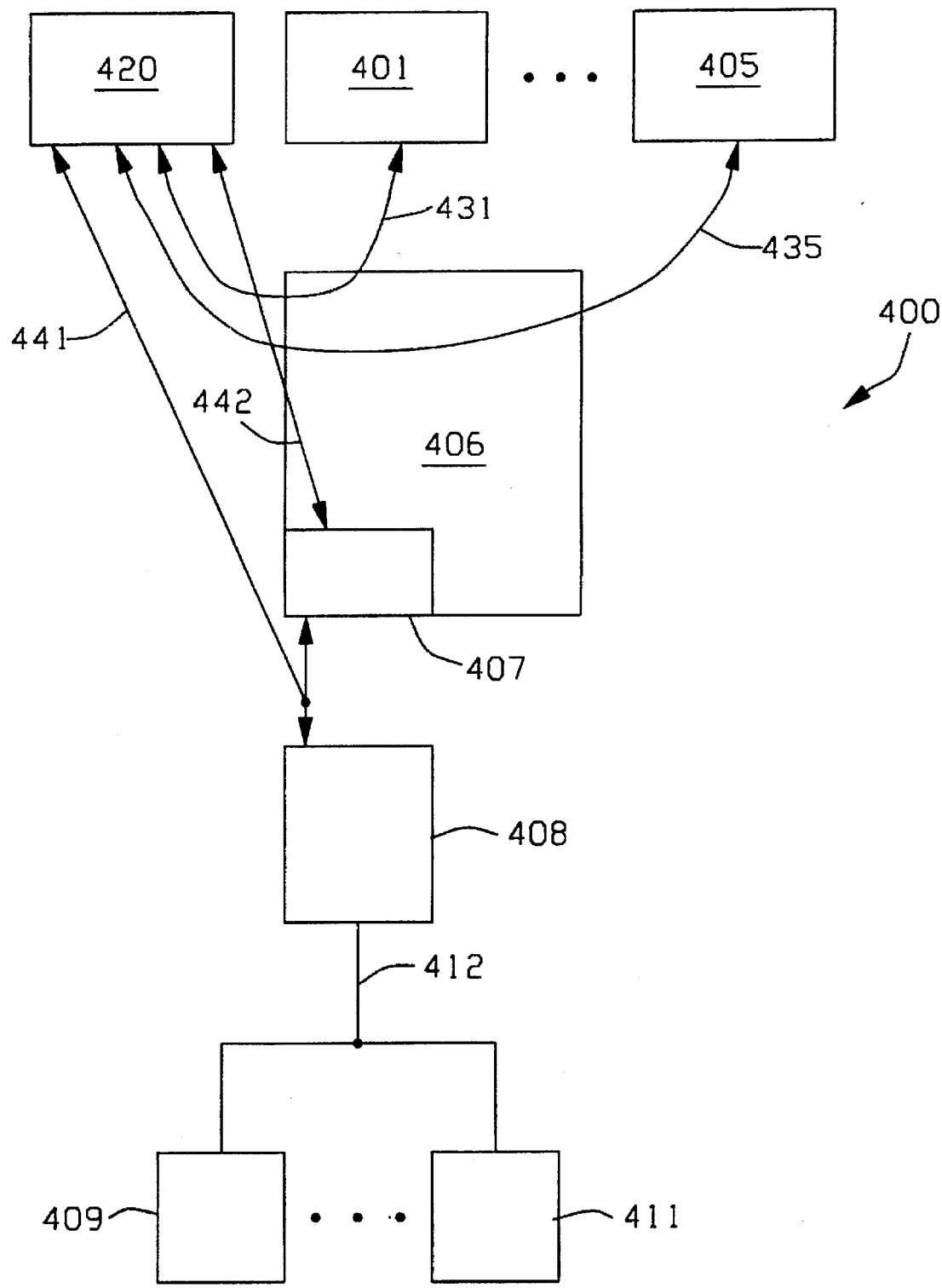
FIG. 4 is a functional block diagram of a system using a second conventional system call based operation.

FIG. 4 depicts a functional block diagram of a system 400 using a second conventional system call based operation. The system 400 contains a plurality of software applications 401–405 that require access to a plurality of target hardware devices or system logic boards 409–411. Unlike the system of FIG. 3, hardware access is accomplished by establishing system call paths 431–435 to a device handler application 420 through an operating system 406. The device handler application 420 uses a combination of system calls 442 to device driver 407 and direct access 441 to I/O controller hardware 408 to perform operations on the hardware devices 409–411. Thus, the device handler application 442 uses the same hardware interface to the I/O controller 408 as does the device driver 407.

An illustrative system of FIG. 4 is an X window graphics display system having a plurality of video displays 409–411 for servicing a plurality of X window client applications 401–405. Thus, the illustrative system comprises a video controller 408, video controller driver 407, I/O bus 412 and X server device management application 420. However, operation 400 still requires the use of a multitude of system calls to access the hardware devices, thereby incurring a substantial I/O overhead.

Figure 5:
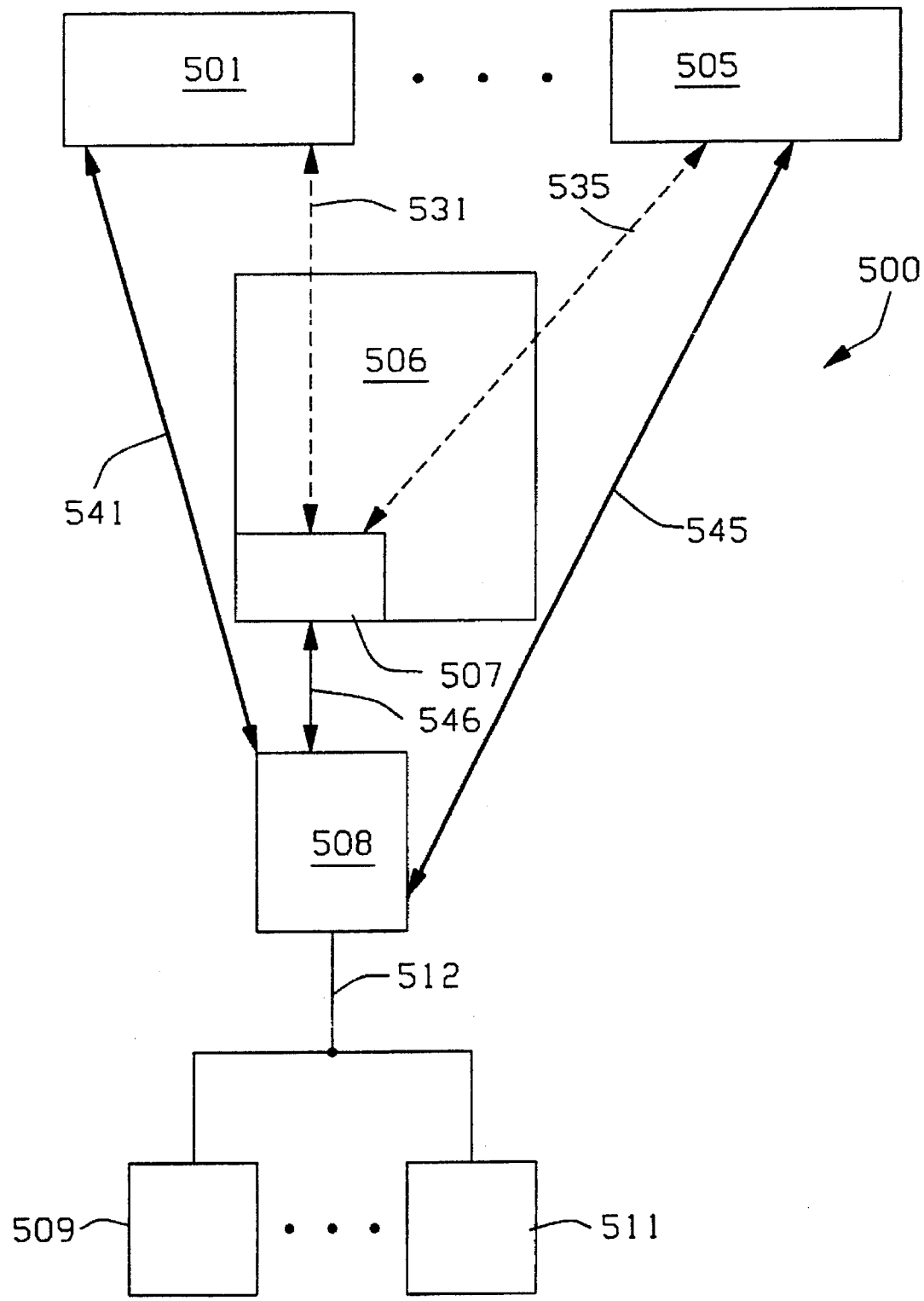
FIG. 5 illustrates the system call-less operation of the present invention.

FIG. 5 depicts a block diagram of a system 500 using a system call-less process of the present invention. The system 500 illustratively contains a plurality of software applications 501–505 that require access to a plurality of target hardware devices or system logic boards 509–511. In the preferred embodiment of the present invention, software applications 501–505 primarily use direct access paths 541–545 to access I/O controller hardware 508 for performing shift operations (e.g. JTAG shift operations) on system logic boards 509–511 via I/O bus 512. System call paths 531–535 to a device driver 507 through operating system 506 are only used to initialize and enable the direct access paths 541–545. Once the direct access paths 541–545 are established, the software applications perform shift operations by making requests directly to the controller hardware 508 without the involvement of the device driver 507. Nevertheless, the device driver 507 may still access the I/O controller hardware 508 through an access path 546.

In the preferred embodiment of the present invention, the I/O controller hardware 508 provides independent access paths 541–545 for each software application 501–505. This feature is accomplished by providing a separate shift access window to each software application such that multiple software applications may simultaneously request for hardware access to perform shift operations without system calls.

Figure 6:
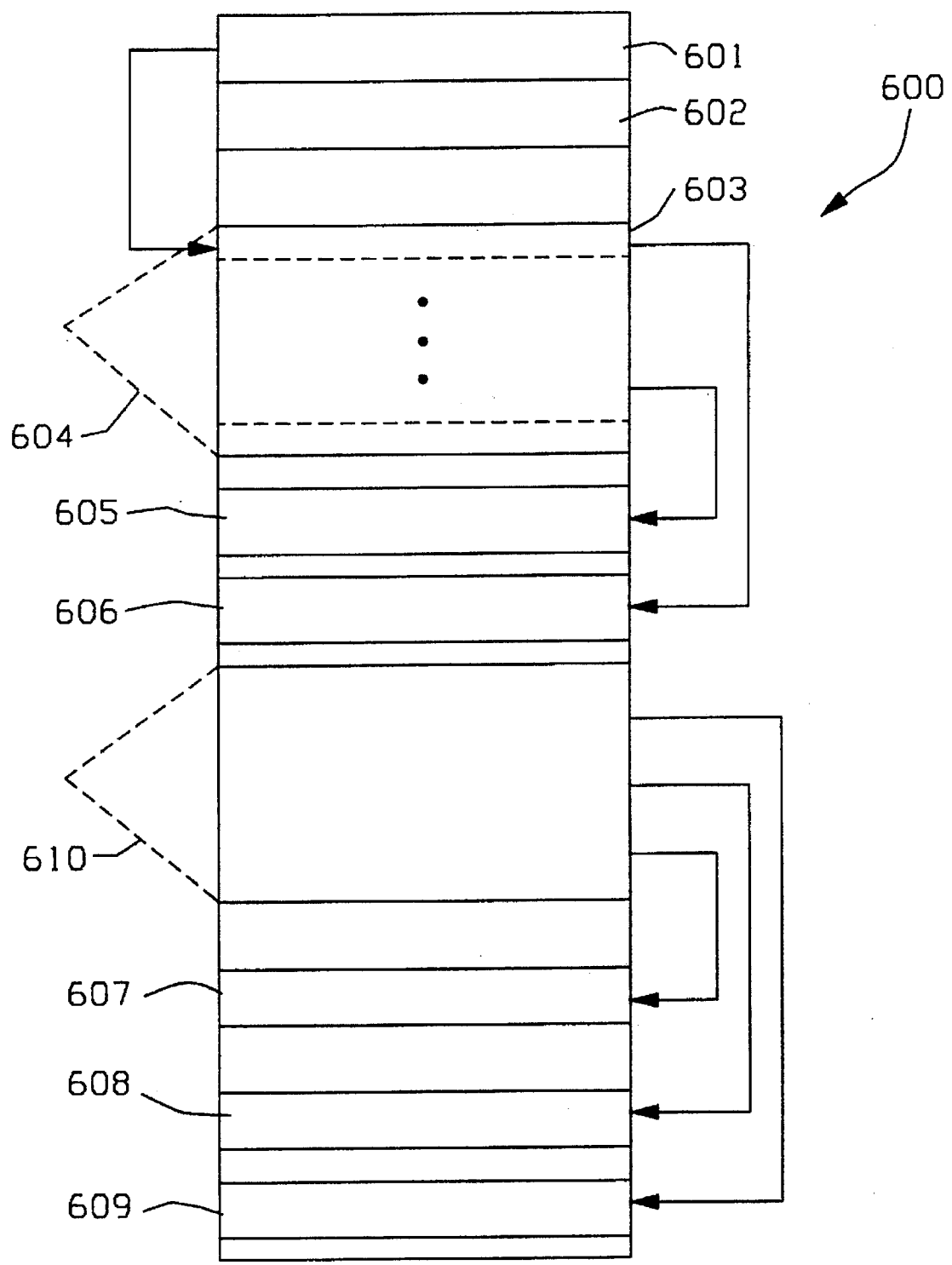
FIG. 6 illustrates the shift access window of the present invention.

FIG. 6 schematically depicts an access window 600 of the present invention. Each shift access window is mapped onto the system memory and is used to store instructions and data for accessing a particular target hardware device (system logic board). In the preferred embodiment of the present invention, 32 shift access windows are incorporated with each having a size of 8K bytes. However, those skilled in the art will realize that different number of shift access windows of a different size can be employed.

Each shift access window 600 contains an I/O control block information structure 601, a shift fail information structure 602, a single I/O control block (IOCB) 603 or a chain of IOCBs 604, 610 and a plurality of buffers 605–609. The IOCB information structure 601 is used to point to a particular IOCB or a IOCB chain to be executed. Optionally, the IOCB information structure 601 serves to specify the TCK speed for a particular shift operation in a system that supports multiple TCK clock speeds.

The shift fail information structure 602 serves to report error information in the event of a failure during a shift operation. Such error information includes the number of TCK pulses issued within the current IOCB, the offset of the IOCB from the start of the shift access window and the types of failure. Thus, a software application receives information about the progress of a shift operation by monitoring its shift access window.

The shift access window 600 defines a fixed length instruction format known as IOCB. Each IOCB 603 contains all the necessary information to define a single complete shift operation which is performed by the system 100 of the present invention. The IOCBs are created by the software applications and the information within the IOCBs is accessed by the system 100. The information includes command information such as the number of lead and trail bypass bits, length and order of a scan path image, field isolation/insertion size and starting location, buffer description and destination for a circular shift. Namely, the IOCB 603 contains all the relevant information to execute the various shift optimization features of the present invention as described above with respect to system 100 of FIGS. 1 and 2.

Furthermore, IOCBs are chained to form an IOCB chain 604 and 610 such that a series of IOCBs is executed automatically to eliminate latency. To execute an IOCB chain, a software application sets an enable bit within an IOCB. As the controller completes a shift operation for the current IOCB, it detects the enable bit and automatically executes the next IOCB in the IOCB chain. The controller automatically executes the entire IOCB chain without having to constantly acquire the next IOCB from a software application. One example is where specific sequences of IOCBs are always performed in a successive order such as an IR shift followed by a DR shift. Additionally, a chain of IOCBs is executed atomically. Namely, the controller will not service another IOCB request until all the IOCBs within the current chain have completed.

Often, an individual IOCB 603 may perform read and/or write operations. In such instances, the IOCB 603 specifies the location of buffer 606 from which data is stored and/or retrieved.

An important benefit of using shift access windows is the ability to allow simultaneous requests for hardware access to perform shift operations from a plurality of software applications. However, in order to ensure process isolation, the present invention incorporates a plurality of status registers 280 (shown in FIG. 2). Each shift access window is linked to a separate status register which displays the operational status of a shift access window. In the preferred embodiment of the present invention, each status register consists of 32 bits and contains status information such as the progress of a shift operation (complete or in progress), the existence of a shift error and the parity error.

In use, each software application simply writes the relevant data and instructions to its shift access window and status register. In response, the controller maintains (as described below with reference to FIG. 7 and FIG. 8) the multitude of status registers and executes any pending requests in accordance with the information stored in each of the shift access window. In this fashion, shift operations are accomplished without the use of system calls and process isolation is achieved.

Figure 7:
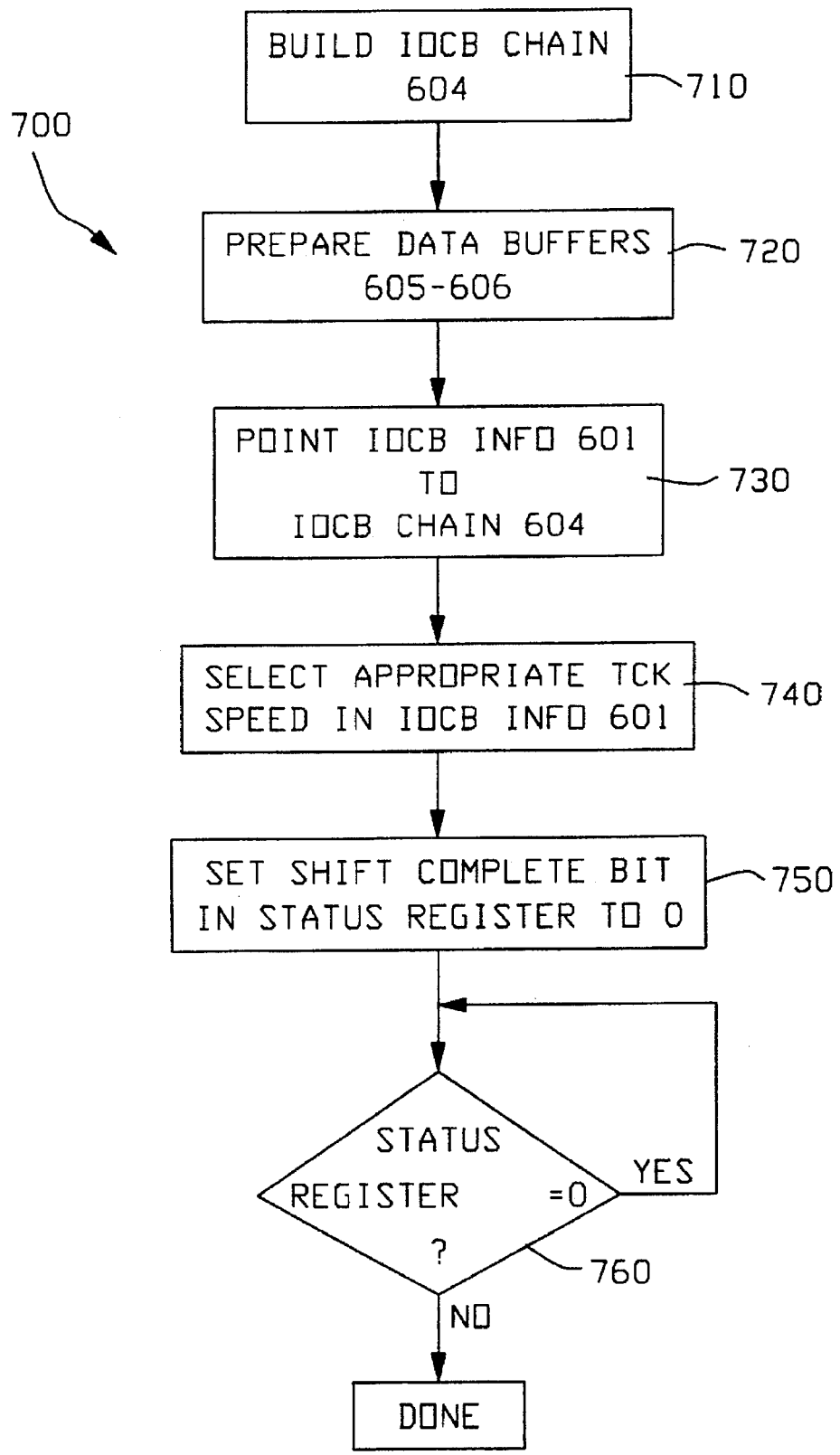
FIG. 7 illustrates a flowchart diagram of performing a polling-based shift operation.

FIG. 7 depicts a flowchart which describes the polling-based shift operation 700 of the present invention. In step 710, a software application 501 builds an IOCB chain 604. This step involves writing instructions and data into a plurality of IOCBs.

In step 720, data buffers 605–606 are prepared for performing read and/or write operations. The IOCBs within the IOCB chain specify the locations of buffers 605–606 from which data is stored and/or retrieved.

In step 730, the software application 501 points the IOCB information structure 601 to IOCB chain 604 to be executed. Optionally, in step 740, the software application 501 may specify a TCK clock speed within the IOCB information structure 601 in a system that supports multiple TCK clock speeds.

In step 750, the software application 501 sets a "shift complete" control bit to a "0" value in its status register 280. This value indicates that a shift operation is queued or in progress. A "1" value indicates a shift operation is not queued or in progress.

In step 760, the status register 280 is polled to determine whether a shift operation is queued or in progress. If the decision is answered in the positive, the process returns to step 760. If the decision is answered in the negative, then the shift operation is completed or no shift operation is queued, thereby ending process 700.

Furthermore, as illustrated in FIG. 6, a shift access window may contain additional IOCB chain 610 and data buffers 607–609. This IOCB chain may not be involved in the current shift operation. In such instance, a software application may optimize a series of shift operations by building an IOCB chain while the controller is executing another IOCB chain.

Figure 8:
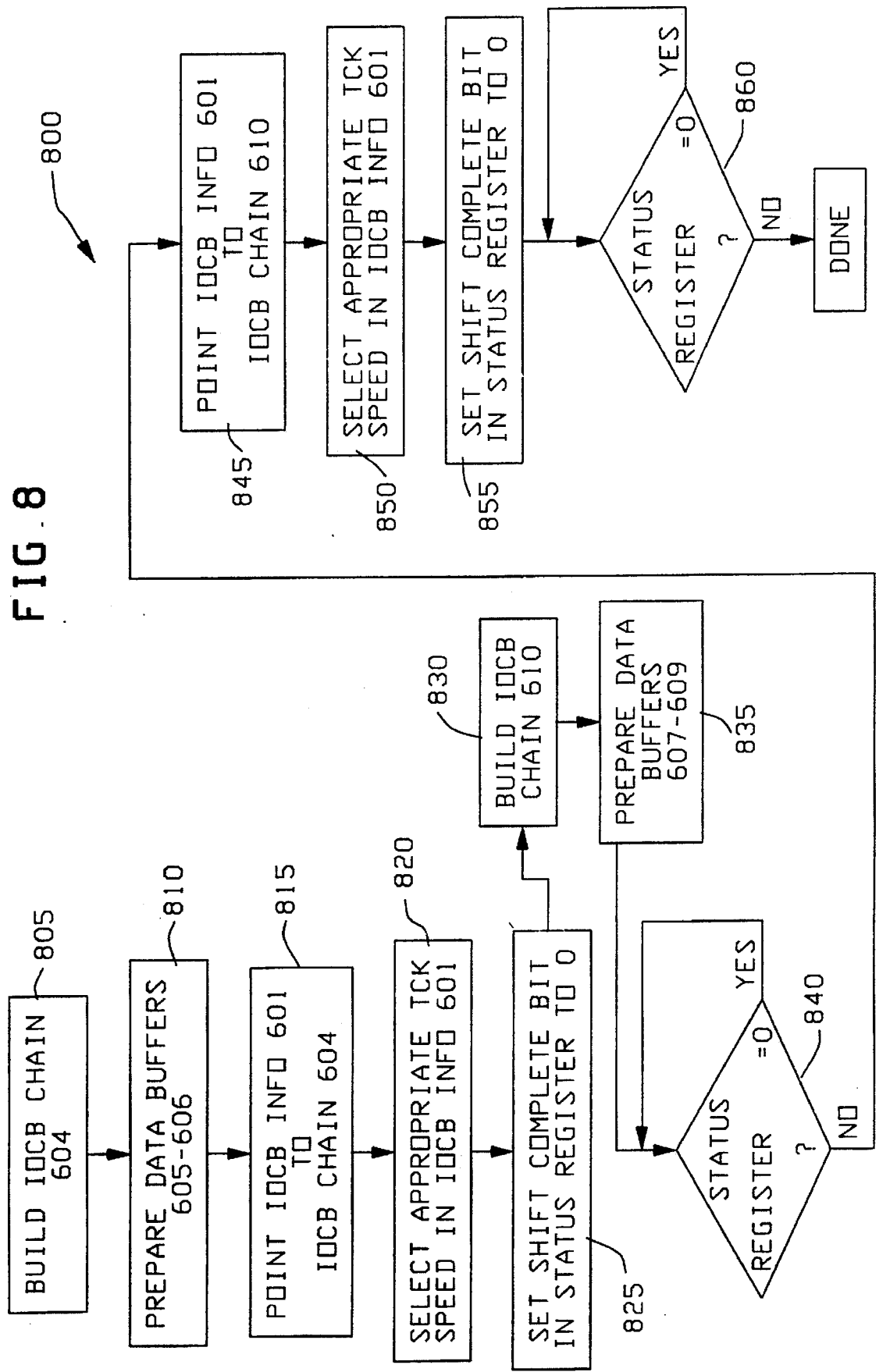
FIG. 8 illustrates a flowchart diagram of performing a concurrent polling-based shift operation.

FIG. 8 depicts a flowchart which describes the process 800 of building one IOCB chain while the controller is executing another IOCB chain. Since steps 805–825 are identical to those of steps 710–750 of FIG. 7, the description of steps 805–825 is referred to the above discussion.

In step 830, the software application 501 begins building a second IOCB chain 610. Since the IOCB chain 604 is completed and the status register is set accordingly, the controller may execute the IOCB chain 604 while the IOCB chain 610 is being built.

In step 835, data buffers 607–609 are prepared for performing read and/or write operations. The IOCBs within the IOCB chain 610 specify the locations of buffers 607–609 from which data is stored and/or retrieved.

In step 840, the status register 280 is polled to determine whether a shift operation is queued or in progress. If the decision is affirmatively answered, the process returns to step 840. If the decision is negatively answered, then process 800 proceeds to step 845.

In step 845, the software application 501 points the IOCB information structure 601 to IOCB chain 610 to be executed. Optionally, in step 850, the software application 501 may specify a TCK clock speed within the IOCB information structure 601 in a system that supports multiple TCK clock speeds.

In step 855, the software application 501 sets a "shift complete" control bit to a "0" value in its status register 280. This value indicates that a shift operation (IOCB chain 610) is queued or in progress.

In step 860, the status register 280 is polled to determine whether a shift operation is queued or in progress. If the decision is affirmatively answered, the process returns to step 860. If the decision is negatively answered, then the shift operation is completed or no shift operation is queued, thereby ending process 800.

In this fashion, the concurrent operation of building and executing two separate IOCB chains is accomplished. However, those skilled in the art will realize that this process is not limited to sequences of two (2) IOCB chains, but can be applied to a sequence of any number of IOCB chains.

Figure 9:
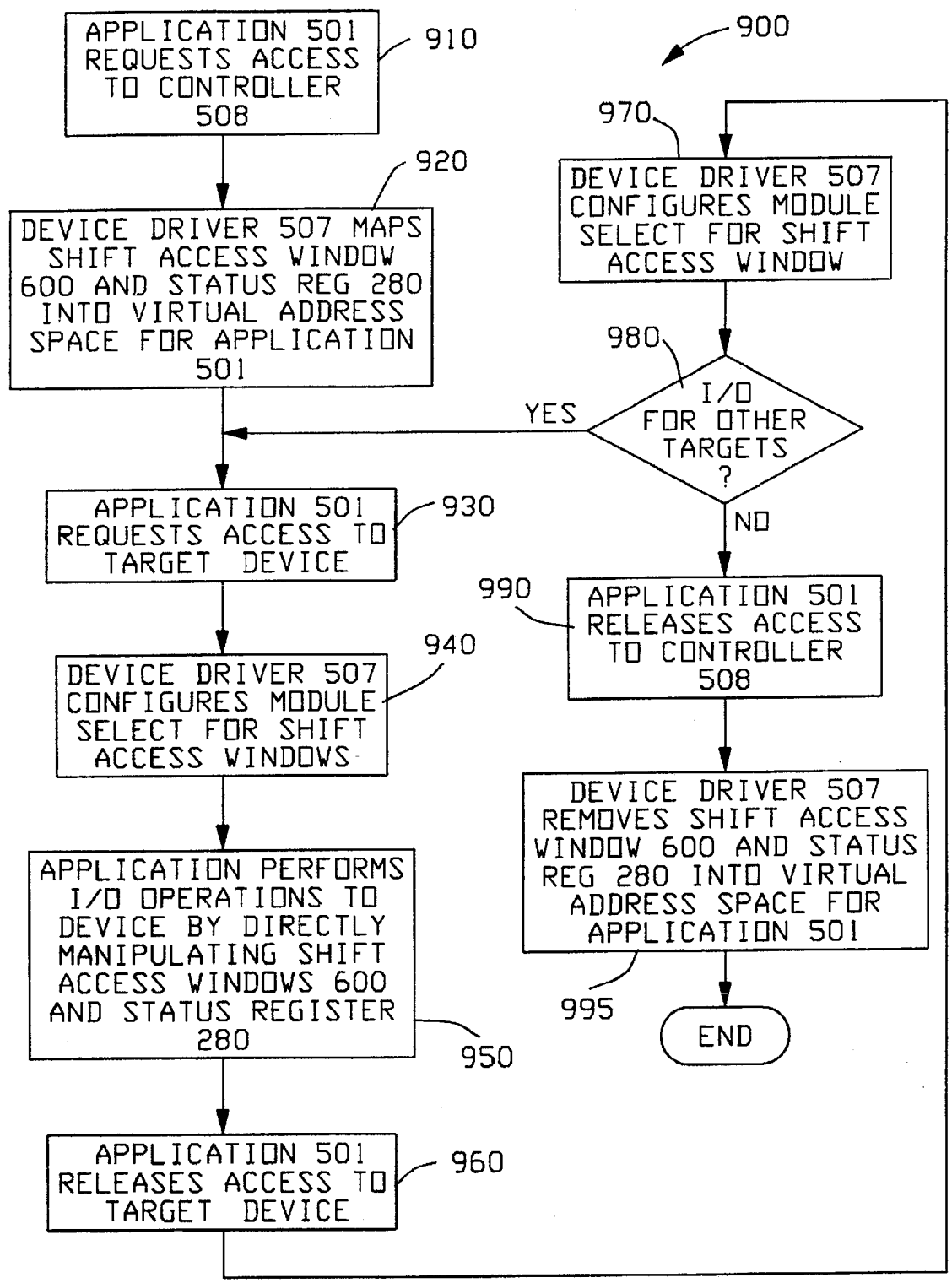
FIG. 9 illustrates a flowchart diagram of performing system call-less shift operation.

FIG. 9 depicts a flowchart of operation of the system 500 of FIG. 5 that uses a system call-less process 900 of the present invention. In step 910, a software application 501 requests access to the controller 508. This initial request is performed by making a system call 531 to the device driver 507.

In step 920, the device driver 507 responds by selecting a shift access window 600 and a status register 280 and maps them into the virtual address space of application 501. Step 920 enables application 501 to now directly access controller 508 to perform shift operations. In the preferred embodiment of the present invention, the shift access window and status register selected by the device driver 507 are guaranteed not to be in use by another software application.

In step 930, application requests access to a specific target device by making a system call 531 to the device driver 507. The target device may include one or more of hardware devices 509–511.

In step 940, the device driver responds by updating a control structure which is controlled by the operating system. The control structure provides additional high level control information and is only needed for performing parallel shift operations to a given set of target devices. The device driver 507 updates a set of "select" values which indicate the corresponding target devices to be controlled by the given shift access window. In the preferred embodiment of the present invention, device driver 507 in step 940 also ensures that a requested target device is not currently under the control of another software application 502–505. Generally, this optional step is provided for a system that supports parallel shifting to multiple target devices.

In step 950, software application 501 directly manipulates its shift access window 600 and status register 280 to perform one or more shift operations (I/O operations) to the selected target device without system calls. At this stage, the various shift operations as disclosed above, are completely executed without the use of system calls, thereby significantly reducing the I/O request overhead.

In step 960, the software application 501 releases access to the target device 509–511 by making a system call 531 to device driver 507.

Therefore, in step 970, the device driver 507 responds by updating the select values within the control structure which corresponds to the shift access window and status register assigned to the application 501 in step 920. The device driver updates the select value to indicate that the given shift access window and status register no longer have access to a given target device.

In step 980, software application 501 determines whether it has additional shift operations destined for other target devices. If the decision is answered in the positive, process 900 returns to step 930 where new target devices 509–511 are selected. If the decision is answered in the negative, the process 500 proceed to step 990.

In step 990, software application 501 releases access to controller 508 by making a system call 531 to device driver 507.

In step 995, the device driver 507 responds by removing the shift access window and status register from the virtual address space for software application 501. This effectively prohibits software application 501 from making further use of the controller 508.

However, although process 900 is described with five (5) software applications 501–505 and three (3) target devices 509–511, those skilled in the art will realize that the present invention does not have such limitation. The process accommodates any finite number of software applications and target devices. In the preferred embodiment of the present invention, process 900 supports 32 software applications and 32 target devices. There is no requirement that the number of software applications matches the number of target devices.

In summary, process 900 provides a number of key benefits such as performing I/O operations (shift operations) without the use of system calls or a device handler as disclosed in the prior art. The software applications are provided with direct access to the target devices.

Second, process 900 provides a multitude of software applications to share the same device controller 508. The controller simply polls the status registers to execute the next pending request. By providing the capability for polling based I/O operations, interrupts, corresponding system calls and device driver involvements are eliminated for the purpose of reporting I/O completion to a software application.

Third, process 900 provides independent memory mapped I/O spaces (shift access window and status register) for each software application. Thus, there is no requirement for software application synchronization during I/O operations, which typically requires the use of additional system calls.

Fourth, process 900 provides independent memory mapped I/O spaces on the virtual memory page boundaries of a host microprocessor (4K bytes on the Intel based 80×86 processor). Thus, hardware capabilities for memory protection are utilized to prevent accidental interference between applications.

Furthermore, the system call-less process of the present invention is not limited to the JTAG I/O bus. In fact, the system call-less process is applicable to other types of I/O buses to perform I/O operations without system calls.

Similarly, the system 100 and its shift optimization features of the present invention are not limited to the JTAG I/O bus. They are applicable to other types of I/O buses to optimize shift operations.

There has thus been shown and described a novel method and system for optimizing shift operations by reducing the computational overhead and the number of full scan path shifts associated with accessing and modifying data on a rotating scan path image. This includes several novel performance improvement features including shift operations without system calls. Many changes, modifications, variations and other uses and applications of the subject invention will, however, become apparent to those skilled in the art after considering this specification and the accompanying drawings which disclose the embodiments thereof. All such changes, modifications, variations and other uses and applications which do not depart from the spirit and scope of the invention are deemed to be covered by the invention, which is to be limited only by the claims which follow.

What is claimed is:

1. A system for accomplishing bit shifting operations between a storage device and a target device, said system comprising:

a selecting means having a plurality of input connections and a data output connection;

a first shifting means, coupled between the storage device and a data input connection, for shifting a plurality of data bits on said data input connection to the storage device, said data input connection is further coupled to an input connection of said selecting means; and a controlling means, coupled to said selecting means and said first shifting means, for controlling said selecting means and said first shifting means to selectively and simultaneously direct said plurality of data bits on said data input connection to said data output connection and to the storage device.

2. The system of claim 1, further comprising a second shifting means, coupled to the storage device, said controlling means and one of said plurality of input connections of said selecting means, where said controlling means controls said second shifting means to direct a plurality of data bits from the storage device to said data output connection.

3. The system of claim 2, wherein said first shifting means comprises a first converting means for converting serial data into parallel data, and wherein said second shifting means comprises a second converting means for converting parallel data into serial data.

4. The system of claim 3, wherein said first shifting means further comprises a counting means for directing said first converting means to selectively convert said data bits from said data input connection in a decrementing order or an incrementing order, and wherein said second shifting means further comprises a counting means for directing said second converting means to selectively convert said data bits from the storage device in a decrementing order or an incrementing order.

5. The system of claim 2, further comprising a first inserting means, coupled to the storage device, said controlling means and one of said plurality of input connections of said selecting means, where said controlling means controls said first inserting means to insert a plurality of bypass bits to said data output connection.

6. The system of claim 5, further comprising a second inserting means, coupled to the storage device, said controlling means and one of said plurality of input connections of said selecting means, where said controlling means controls said second inserting means to insert a plurality of bypass bits to said data output connection.

7. The system of claim 6, further comprising:

a first interfacing means, coupled between said first shifting means and the storage device, for writing data to the storage device; and a second interfacing means, coupled between said second shifting means and the storage device, for reading data from the storage device.

8. The system of claim 6 wherein said selecting means is a multiplexor and the storage device is a memory.

9. A system for accomplishing bit shifting operations between a storage device and a target device, said system comprising:

a selecting means having a plurality of input connections and a data output connection;

a first inserting means, coupled to the storage device and one of said plurality of input connections of said selecting means, for inserting a plurality of bypass bits to said data output connection; and a controlling means, coupled to said selecting means and said first inserting means, for controlling said first inserting means to insert a programmable number of bypass bits and for controlling said selecting means to direct said programmable number of bypass bits to said data output connection.

10. The system of claim 9, further comprising a second inserting means, coupled to the storage device and one of said plurality of input connections of said selecting means, for inserting a plurality of bypass bits to said data output connection, wherein said controlling means selectively controls said first and second inserting means to insert a programmable number of bypass bits to said data output connection.

11. The system of claim 10, wherein said controlling means controls said first inserting means to insert a programmable number of lead bypass bits before a stream of data from the storage device, and wherein said controlling means controls said second inserting means to insert a programmable number of trail bypass bits after said stream of data from the storage device.

12. A method of reducing the number of bit shifting operations between a storage device and a target device, comprising the steps of:

(a) shifting selectively a stream of data bits from a data input connection to the storage device;

(b) receiving said stream of data bits from said data input connection to a multiplexor; and (c) selectively directing through said multiplexor said stream of data bits from said data input connection to a data output connection for returning said stream of data bits back to the target device as said stream of data bits are shifted into the storage device.

13. The method of claim 12, wherein said stop (a) includes the step of converting said stream of data bits into an incrementing or decrementing parallel form.

14. The method of claim 12, further comprising the steps of:

(d) shifting a stream of data bits from the storage device to said multiplexor; and (e) selectively replacing said stream of data bits from said data input connection with said stream of data bits from the storage device.

15. The method of claim 14, wherein said stop (d) includes the step of converting said stream of data bits into an incrementing or decrementing serial form.

16. The method of claim 14, further comprising the step of:

(f) isolating a field of data bits of said stream of data bits from said data input connection; and wherein said shifting step (a) shifts said isolated field of data bits to the storage device.

17. The method of claim 14, further comprising the steps of:

(f) isolating a plurality of fields of data bits of said stream of data bits from said data input connection;

(g) rotating unselected data bits from said data input connection to said data output connection; and wherein said shifting step (a) only shifts said plurality of isolated fields of data bits to the storage device.

18. The method of claim 14, further comprising the stop of:

(f) isolating a field of data bits of said stream of data bits from said data input connection; and wherein said replacing step (e) selectively replaces said isolated field of data bits of said stream of data bits from said data input connection with said stream of data bits from the storage device.

19. The method of claim 14, further comprising the steps of:

(f) isolating a field of data bits of said stream of data bits from said data input connection;

(g) rotating unselected data bits from said data input connection to said data output connection; and wherein said replacing step (e) selectively replaces said plurality of isolated fields of data bits of said stream of data bits from said data input connection with said stream of data bits from the storage device.

20. The method of claim 14, further comprising the stop of:

(f) isolating a field of data bits of said stream of data bits from said data input connection; and wherein said shifting step (a) shifts said isolated field of data bits to the storage device and wherein said replacing step (e) selectively replaces said isolated field of data bits of said stream of data bits from said data input connection with said stream of data bits from the storage device.

21. The method of claim 14, further comprising the stop of:

(f) isolating a plurality of fields of data bits of said stream of data bits from said data input connection;

(g) rotating unselected data bits from said data input connection to said data output connection; and wherein said shifting step (a) shifts said plurality of isolated fields of data bits to the storage device and wherein said replacing step (e) selectively replaces said plurality of isolated fields of data bits of said stream of data bits from said data input connection with said stream of data bits from the storage device.

22. A method of constructing a scan path image, comprising the steps of:

(a) shifting a programmable number of lead bypass bits to a multiplexor from a bypass module;

(b) selecting said multiplexor to direct said lead bypass bits to a data output connection;

(c) shifting a selected stream of data bits from a storage device;

(d) selecting said selected stream of data bits from said storage device to said data output connection;

(e) shifting a programmable number of trail bypass bits to said multiplexor; from said bypass module; and (f) selecting said multiplexor to direct said trail bypass bits to said data output connection to complete the scan path image.

23. A method of performing Input/Output (I/O) operation, comprising the step of:

(a) requesting access to a controller by an application;

(b) mapping a shift access window and a status register to a virtual memory space of said application;

(c) requesting access to a target device; and (d) manipulating said shift access window and said status register to perform an I/O operation on said target device.

24. The method of claim 23, wherein said manipulating step (d) includes the step of:

(d1) building an I/O control block;

(d2) preparing a data buffer;

(d3) pointing an I/O control block information structure to said I/O control block; and (d4) setting said status register to indicate a queued I/O operation.

25. The method of claim 23, wherein said manipulating step (d) includes the step of:

(d1) building an I/O control block chain;

(d2) preparing a data buffer;

(d3) pointing an I/O control block information structure to said I/O control block; and (d4) setting said status register to indicate a queued I/O operation.

26. A method of performing a polling based shift operation, comprising the step of:

(a) building a first I/O control block for performing a first shift operation;

(b) preparing a data buffer to transfer data during said first shift operation;

(c) pointing an I/O control block information structure to said I/O control block;

(d) setting a status register to indicate a queued shift operation; and (e) polling said status register by a controller to determine whether a shift operation is queued.

27. The method of claim 26, further comprising the steps of:

(f) building a second I/O control block for performing a second shift operation while said first shift operation is being executed by said controller;

(g) preparing a second data buffer to transfer data during said second shift operation;

(h) pointing said I/O control block information structure to said second I/O control block; and (I) setting said status register to indicate a queued shift operation.

28. A method of performing I/O operation, comprising the step of:

(a) requesting access to a controller by an application;

(b) mapping a shift access window and a status register to a virtual memory space of said application;

(c) requesting access to a target device;

(d) manipulating said shift access window and said status register to hold a set of data and instruction; and (e) performing an I/O operation in accordance with said set of data and instruction.

29. The method of claim 28, wherein said performing step (e) includes the steps of:

(e1) shifting selectively a stream of data bits from a data input connection to a storage device;

(e2) receiving said stream of data bits from said data input connection to a multiplexor; and (e3) selectively directing through said multiplexor said stream of data bits from said data input connection to a data output connection for returning said stream of data bits back to the target device as said stream of data bits are shifted into the storage device.

30. The method of claim 28, wherein said performing step (e) further includes the steps of:

(e4) shifting a stream of data bits from the storage device to said multiplexor; and (e5) selectively replacing said stream of data bits from said data input connection with said stream of data bits from the storage device.

31. The method of claim 28, wherein said performing step (e) includes the steps of:

(e1) shifting a programmable number of lead bypass bits to a multiplexor from a bypass module;

(e2) selecting said multiplexor to direct said lead bypass bits to a data output connection;

(e3) shifting a selected stream of data bits from a storage device;

(e4) selecting said selected stream of data bits from said storage device to said data output connection;

(e5) shifting a programmable number of trail bypass bits to said multiplexor; from said bypass module; and (e6) selecting said multiplexor to direct said trail bypass bits to said data output connection to complete the scan path image.

* * * * *